United States Patent
Chang

(10) Patent No.: US 8,710,859 B2
(45) Date of Patent: Apr. 29, 2014

(54) METHOD FOR TESTING MULTI-CHIP STACKED PACKAGES

(75) Inventor: Kai-Jun Chang, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 264 days.

(21) Appl. No.: 13/242,400

(22) Filed: Sep. 23, 2011

(65) Prior Publication Data

US 2013/0076384 A1    Mar. 28, 2013

(51) Int. Cl.
*G01R 31/28* (2006.01)
*H01L 21/66* (2006.01)

(52) U.S. Cl.
USPC ............ 324/756.01; 324/756.02; 324/756.07; 324/757.04; 324/757.05; 324/762.02; 324/762.06; 438/15; 438/17; 438/55; 438/118; 257/777; 257/E21.521; 257/E21.525; 257/E21.599

(58) Field of Classification Search
USPC ............ 324/756.01, 756.02, 757.01, 757.04, 324/757.05, 762.01–762.06, 754.01; 438/10, 17, 106–114, 118, 55, 15; 257/777, E21.521, E21.525, E25.013
See application file for complete search history.

(56) References Cited

U.S. PATENT DOCUMENTS

| | | | |
|---|---|---|---|
| 6,495,379 B2 * | 12/2002 | Iketani | 438/15 |
| 6,544,033 B1 * | 4/2003 | Scudder et al. | 432/53 |
| 6,806,725 B2 * | 10/2004 | Tsui et al. | 324/750.23 |
| 6,905,891 B2 * | 6/2005 | Kovar et al. | 438/14 |
| 7,329,569 B2 * | 2/2008 | Haberern et al. | 438/164 |
| 7,358,119 B2 * | 4/2008 | McLellan et al. | 438/127 |
| 7,531,432 B2 * | 5/2009 | Arshad et al. | 438/460 |
| 7,973,310 B2 * | 7/2011 | Wang et al. | 257/48 |
| 2007/0037320 A1 * | 2/2007 | Mostafazadeh et al. | 438/108 |
| 2008/0084016 A1 * | 4/2008 | Kubo | 269/59 |
| 2011/0074017 A1 | 3/2011 | Morifuji et al. | |
| 2011/0147911 A1 * | 6/2011 | Kohl et al. | 257/686 |
| 2011/0300647 A1 * | 12/2011 | Jarry et al. | 438/14 |
| 2011/0306166 A1 * | 12/2011 | Blaney | 438/111 |

* cited by examiner

*Primary Examiner* — Huy Phan
*Assistant Examiner* — James Split
(74) *Attorney, Agent, or Firm* — Muncy, Geissler, Olds & Lowe, P.C.

(57) ABSTRACT

Disclosed is a method for testing multi-chip stacked packages. Initially, one or more substrate-less chip cubes are provided, each consisting of a plurality of chips such as chips stacked together having vertically connected with TSV's where there is a stacked gap between two adjacent chips. Next, the substrate-less chip cubes are adhered onto an adhesive tape where the adhesive tape is attached inside an opening of a tape carrier. Then, a filling encapsulant is formed on the adhesive tape to completely fill the chip stacked gaps. Next, the tape carrier is fixed on a wafer testing carrier in a manner to allow the substrate-less chip cubes to be loaded into a wafer tester without releasing from the adhesive tape. Accordingly, the probers of the wafer tester can be utilized to probe testing electrodes of the substrate-less chip cubes so that it is easy to integrate this testing method in TSV fabrication processes.

9 Claims, 10 Drawing Sheets

METHOD FOR TESTING MULTI-CHIP STACKED PACKAGES

FIELD OF THE INVENTION

The present invention relates to a manufacture method of semiconductor devices, and more specifically to a method for testing multi-chip stacked packages.

BACKGROUND OF THE INVENTION

Multi-chip packaging is an advanced high-density packaging technology to vertically stacking a plurality of dice within the same package. The existing packaging method is to stack individual chips onto a substrate followed by corresponding packaging and testing processes. However, using a substrate increases overall package thickness and footprint.

In order to reduce the dimension of a multi-chip package, there is an attempt to stack a plurality of chips using wafer-to-wafer bonding to manufacture a substrate-less chip cube such as related technology revealed in US Patent No. 2011/0074017. However, bad chips are always randomly present within a wafer, therefore, wafer-to-wafer bonding would cause overall packaging yield of substrate-less chip cubes to drop. Moreover, when a substrate is eliminated, the pitch between the external electrical electrodes or/and the testing electrodes of a chip cube is shrunk from a few hundred micrometer down below a hundred micrometer so that the existing pogo pins of a tester for conventional semiconductor packages can not be used. There are two solutions to resolve the shrunk pitch issue. The first one is to directly SMT bond the substrate-less chip cube onto a board without any testing followed by a module test without ensuring the electrical joints between the stacked chips good or bad. The other one is to directly mount the substrate-less chip cube onto an interposer (normally made of Si) with fan-out circuitry and fan-out electrodes then load the interposer into a tester having pogo pins to perform testing where the overall testing cost is quite complicated and expensive.

SUMMARY OF THE INVENTION

The main purpose of the present invention is to provide a method for testing multi-chip stacked packages to achieve fine-pitch probing of substrate-less chip cubes which can easily be integrated into TSV packaging processes.

The second purpose of the present invention is to provide a method for testing multi-chip stacked packages to test one or more substrate-less chip cubes before SMT on boards and to reduce the number of adhering steps of adhesive tapes to achieve lower packaging cost and to prevent SMT bonding bad substrate-less chip cube on boards.

According to the present invention, a method for testing multi-chip stacked packages is revealed. Firstly, one or more substrate-less chip cubes are provided, each of which consisting of a plurality of vertically stacked chips where a stacked gap is formed between two adjacent chips and each substrate-less chip cube has a plurality of testing electrodes disposed on a top chip surface. Then, the substrate-less chip cubes are attached onto an adhesive tape where the testing electrodes are away from the adhesive tape with the adhesive tape attached inside an opening of a tape carrier. Then, a filling encapsulant is disposed on the adhesive tape to fully fill the stacked gaps between adjacent chips. Then, the tape carrier is fixed on a wafer testing carrier so that the substrate-less chip cubes can be loaded into a wafer tester without releasing from the adhesive tape. Finally, a plurality of testing probes of a probe card mounted on the probe head of a wafer tester probe on the testing electrodes to electrically test the substrate-less chip cubes.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

According to the preferred embodiment of the present invention, the method for testing multi-chip stacked packages is revealed where cross-sectional component views of each processing step of the method for testing multi-chip stacked packages is illustrated in FIG. 1A to FIG. 1I.

Figure 1A:
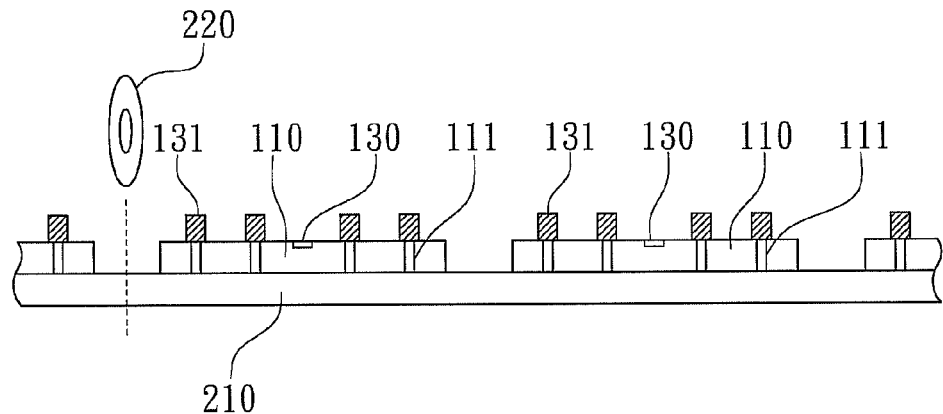
FIGS. 1A to 1I are cross-sectional component views illustrating main processing steps of the method for testing multi-chip stacked packages according to the preferred embodiment of the present invention.
Figure 1B:
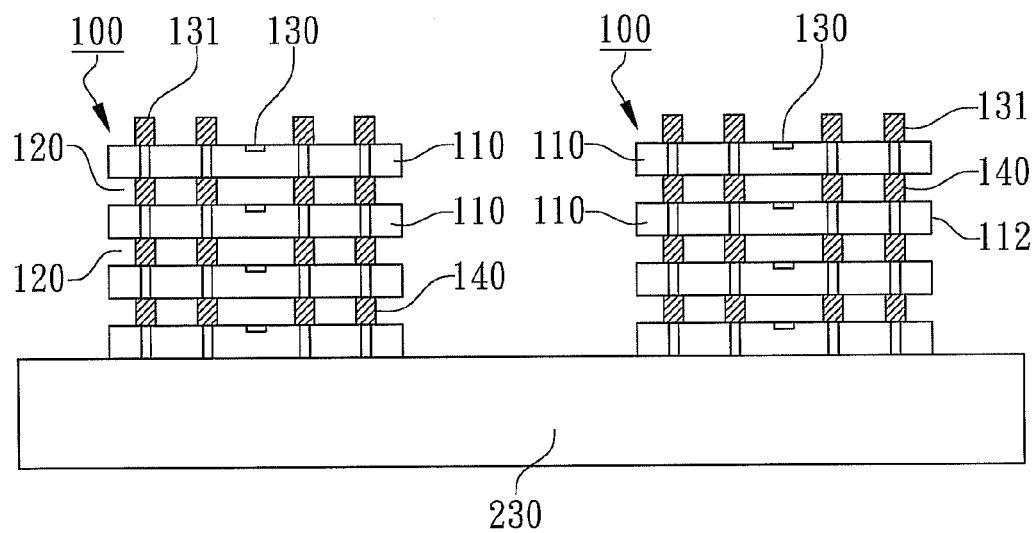

FIG. 1A and FIG. 1B illustrate the manufacture processing flow of the substrate-less chip cubes 100. Firstly, as shown in FIG. 1A, a plurality of chips 110 are formed from dicing a wafer where a plurality of testing electrodes 130 and a plurality of external electrodes 131 are disposed on a top chip surface of each chip 110. During dicing and after dicing, the chips 110 are adhered on a dicing tape 210 where the dicing tape 210 is adhered to a wafer frame (not shown in the figures). During dicing processes, a dicing blade 220 cuts through the scribe lines of a wafer to form individual chips 110. After wafer testing, known good dices 110 are sorted and collected. As shown in FIG. 1B, a plurality of chips 110 are vertically stacked on a chip carrier 230 to form one or more substrate-less chip cubes 100 where a stacked gap 120 is formed between two adjacent chips 110 and a plurality of testing electrodes 130 are disposed a top chip surface of each substrate-less chip cube 100 where the testing electrodes 130 may be metal pads or bumps. In this embodiment, the testing electrodes 130 are central pads exposed from the topmost active surface of the top chip 110. Moreover, a plurality of external electrodes 131 are disposed on the top chip surface of the topmost chip 110 such as copper pillars, solder balls, or metal bumps where normally the pitch between the testing electrodes 130 is larger than the pitch between the external electrodes 131, the testing electrodes 130 are electrically connected with the corresponding external electrodes 131. In the present embodiment, the pitch between the testing electrodes ranges from 60 um to 100 um and the pitch between external electrodes 131 ranges from 30 um to 60 um. In a various embodiment, the external electrodes 131 can be eliminated and the testing electrodes 130 can be used also as the external electrodes 131. As shown in FIG. 1B, in the present embodiment, each chip 110 has a plurality of TSVs (through silicon vias) 111 inside which are electrically connected to the external electrodes 131 where the TSVs 111 and the external electrodes 131 may be vertically connected and RDL (not shown in the figures) is implemented to electrically connect to the testing electrodes 130. Furthermore, a plurality of interconnecting electrodes 140 are disposed between the stacked gaps 120 of the substrate-less chip cubes 100 to electrically connect the TSVs 111. The interconnecting electrodes 140 can be formed by the external electrodes 131 of the chips 110 before chip stacking or by additionally disposed components such as the combination of metal pillars and solder paste.

Figure 1C:
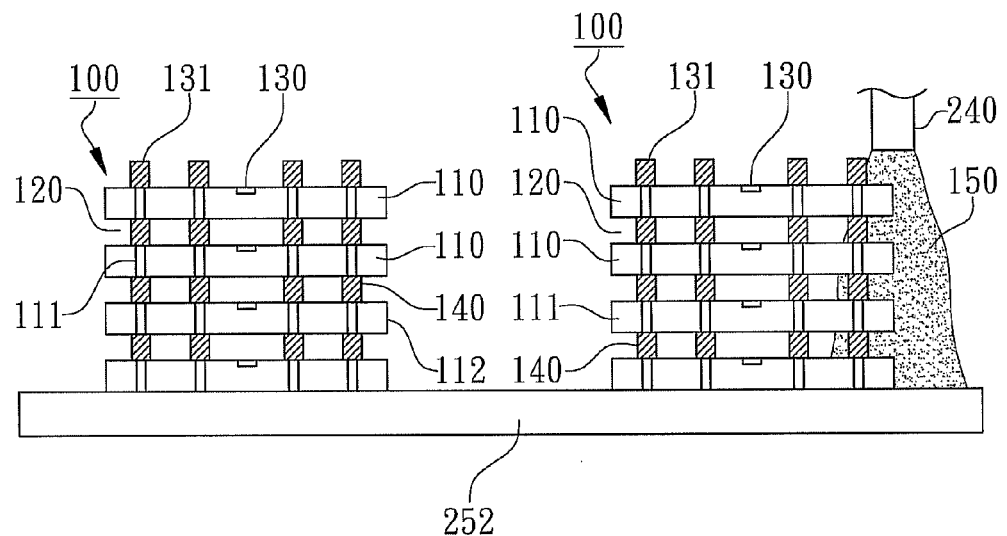

Then, as shown in FIG. 1C, the substrate-less chip cubes 100 are attached onto an adhesive tape 252 where the testing electrodes 130 are away from the adhesive tape 252. The adhesive tape 252 has adhesive to adhere the substrate-less chip cubes 100. The adhesive tape 252 is also attached inside an opening 251 of a tape carrier 250 as shown in FIG. 1F where normally the tape carrier 250 is strip-like metal frame. The step of disposing the adhesive tape 252 on the tape carrier 250 can be performed before or after the step of forming a filling encapsulant. In the present embodiment, the step of disposing the adhesive tape 252 disposed on the tape carrier 250 is performed after dispensing and before curing the filling encapsulant where the tape carrier 250 is implemented as a loading carrier to transfer the substrate-less chip cubes 100 into a baking oven.

Figure 1D:
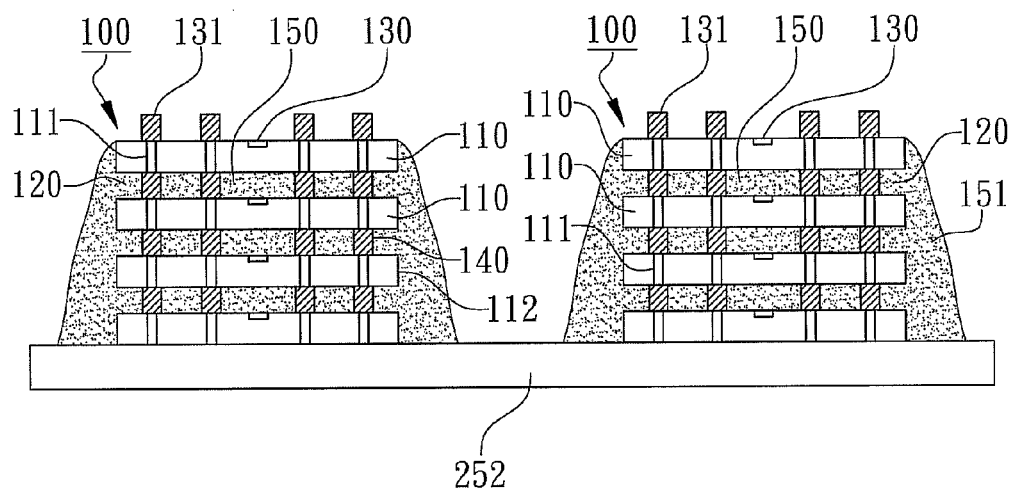

Then, as shown in FIG. 1C again, a filling encapsulant 150 is provided by a dispensing needle 240 where the filling encapsulant 150 is formed on top of the adhesive tape 252 and the filling encapsulant 150 is able to completely fill the stacked gaps 120 under appropriate temperatures with appropriate time to create capillary attraction and encapsulate the interconnecting electrodes 140 as shown in FIG. 1D. Then, the filling encapsulant 150 is thermally cured by a baking oven.

Figure 1E:
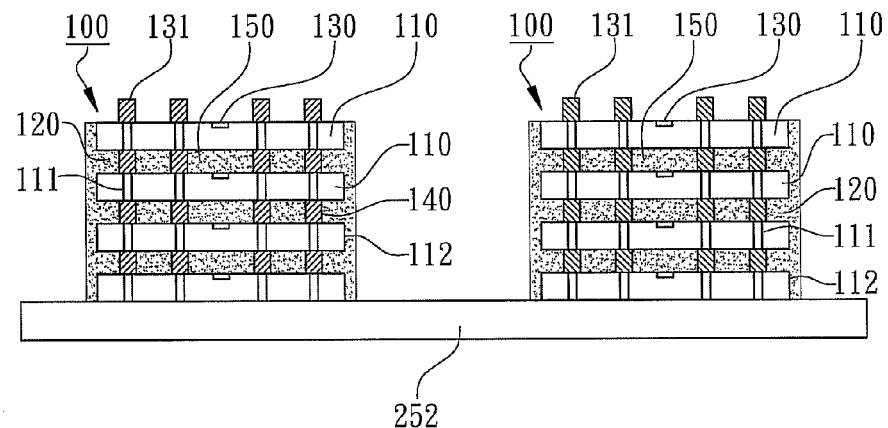
Figure 1F:
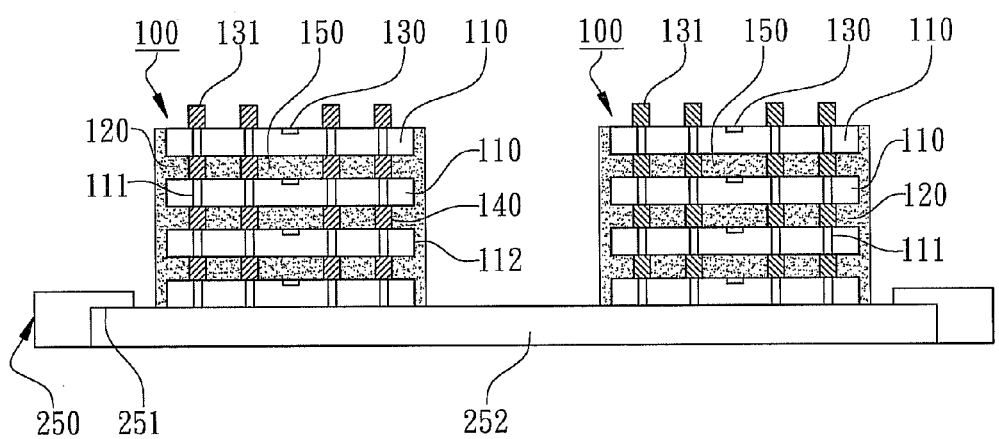

As shown from FIG. 1D to FIG. 1E, in the aforementioned described step of forming the filling encapsulant 150 includes a de-bleeding step of removing a bleeding portion 151 of the filling encapsulant 150 exceeding the footprints of the substrate-less chip cubes 100 to make the substrate-less chip cubes 100 more like a cube. The aforementioned described step of removing bleeding can be performed before or after curing the filling encapsulant 150. For example, when the de-bleeding step is performed after curing the filling encapsulant 150, the bleeding 151 can be removed by a laser cutting tool. In the present embodiment, the aforementioned described de-bleeding step can be performed before curing the filling encapsulant 150 by exposure and development. As shown in FIG. 1E, preferably, after the de-bleeding step, the filling encapsulant 150 still encapsulates a plurality of sidewalls 112 of the chips 110 to effectively protect the chips 110 stacked in the substrate-less chip cubes 100.

Figure 1G:
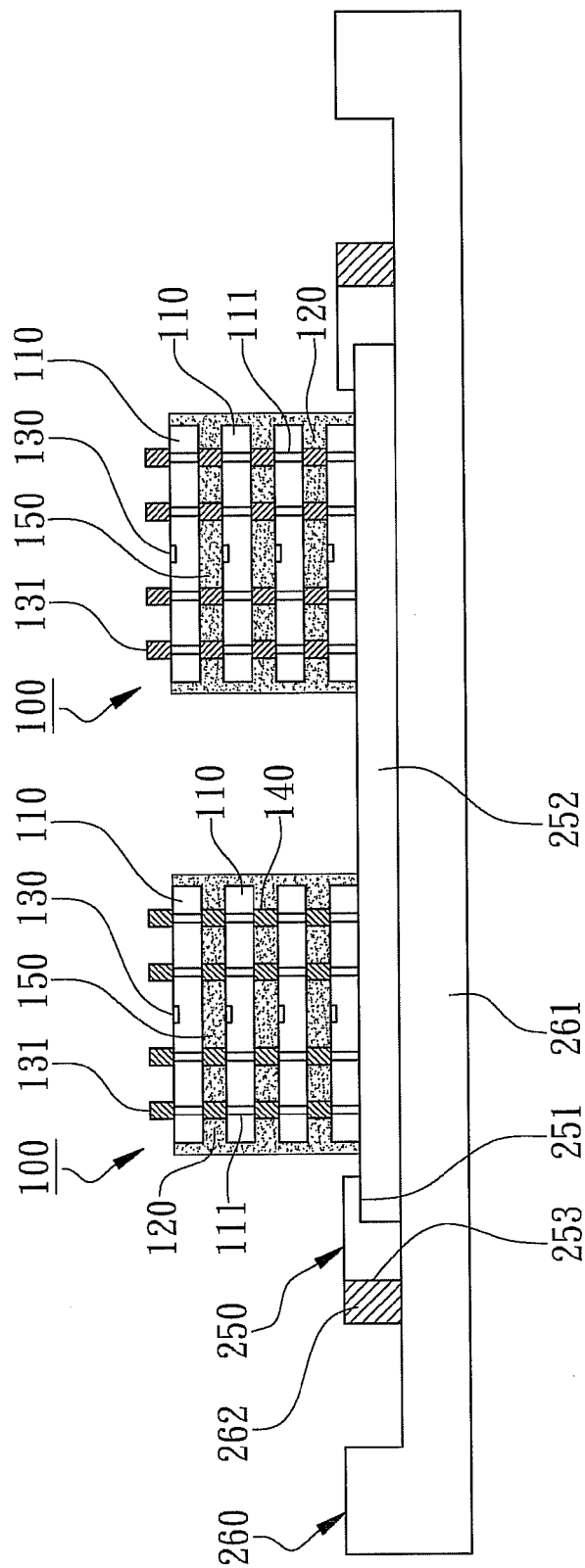
Figure 1H:
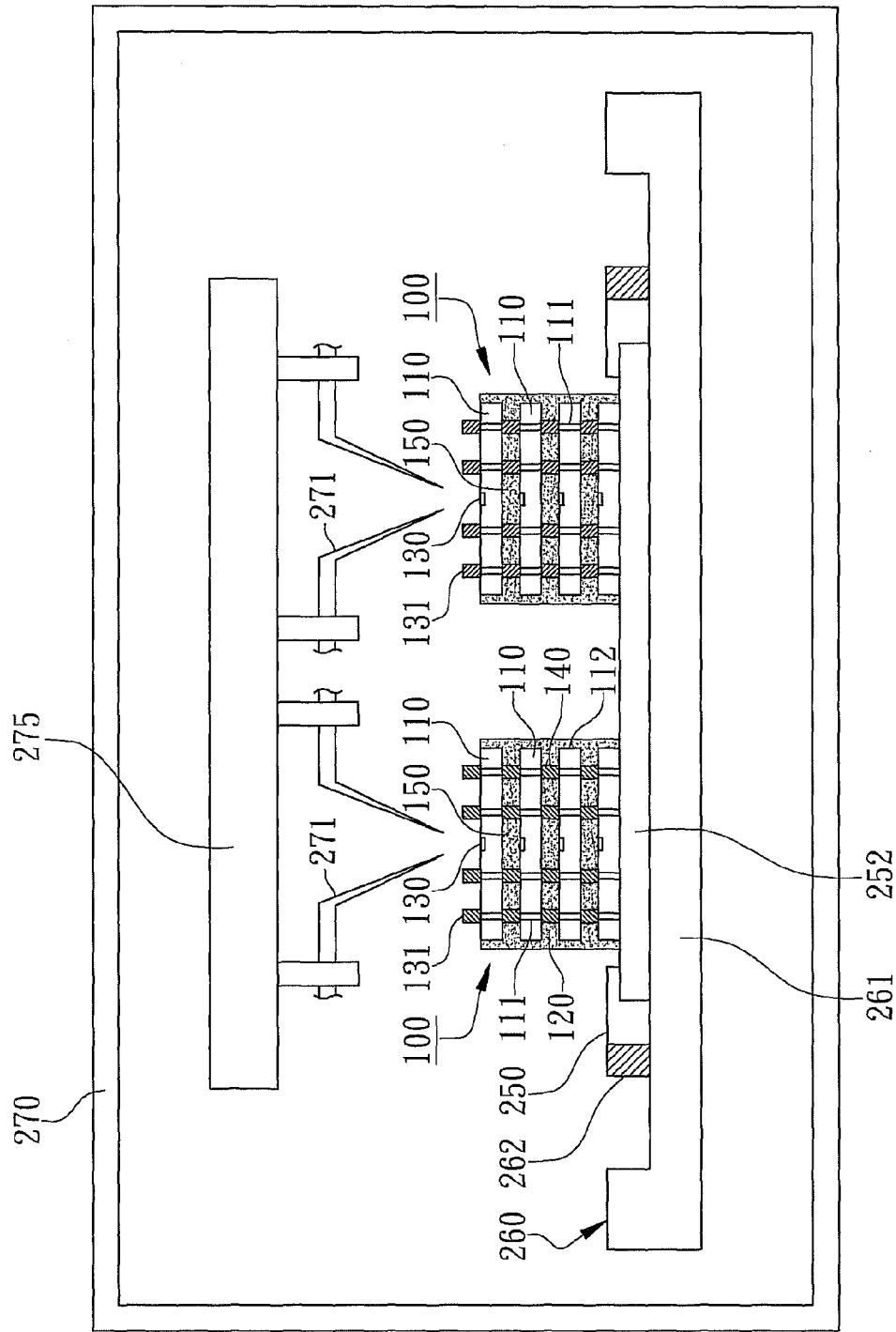
Figure 4:
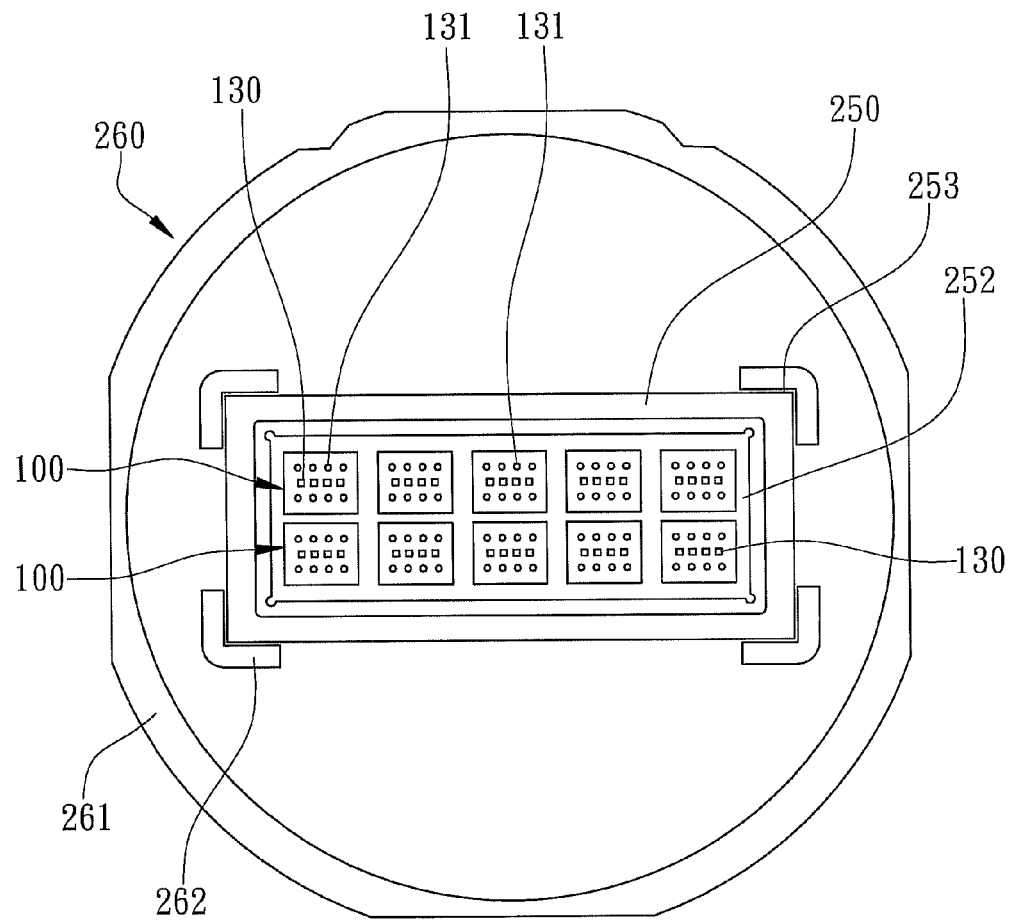
FIG. 4 is a top view illustrating a tape carrier loaded on the wafer testing carrier of FIG. 2A according to the preferred embodiment of the present invention.

Then, as shown in FIG. 1G, the tape carrier 250 is fixed on a wafer testing carrier 260 to allow the substrate-less chip cubes 100 without releasing from the adhesive tape 252 to be loaded into a wafer tester 270 as shown in FIG. 1H. As shown in FIG. 4, the wafer testing carrier 260 can be larger than the tape carrier 250 where both can have different shapes where the wafer testing carrier 260 can carry the tape carrier 250 to form interchangeable modularized jigs. In the present embodiment, the wafer testing carrier 260 is a round disc having a ring looked like a conventional wafer frame. However, in the present embodiment, the major difference between the wafer testing carrier 260 and the conventional wafer frame is that there is no opening penetrating through the wafer testing carrier 260 and there is no dicing tape to adhere a wafer through the wafer testing carrier 260. The shape of the tape carrier 250 can be strip-like such as substrate strips for transferring substrates.

Figure 2A:
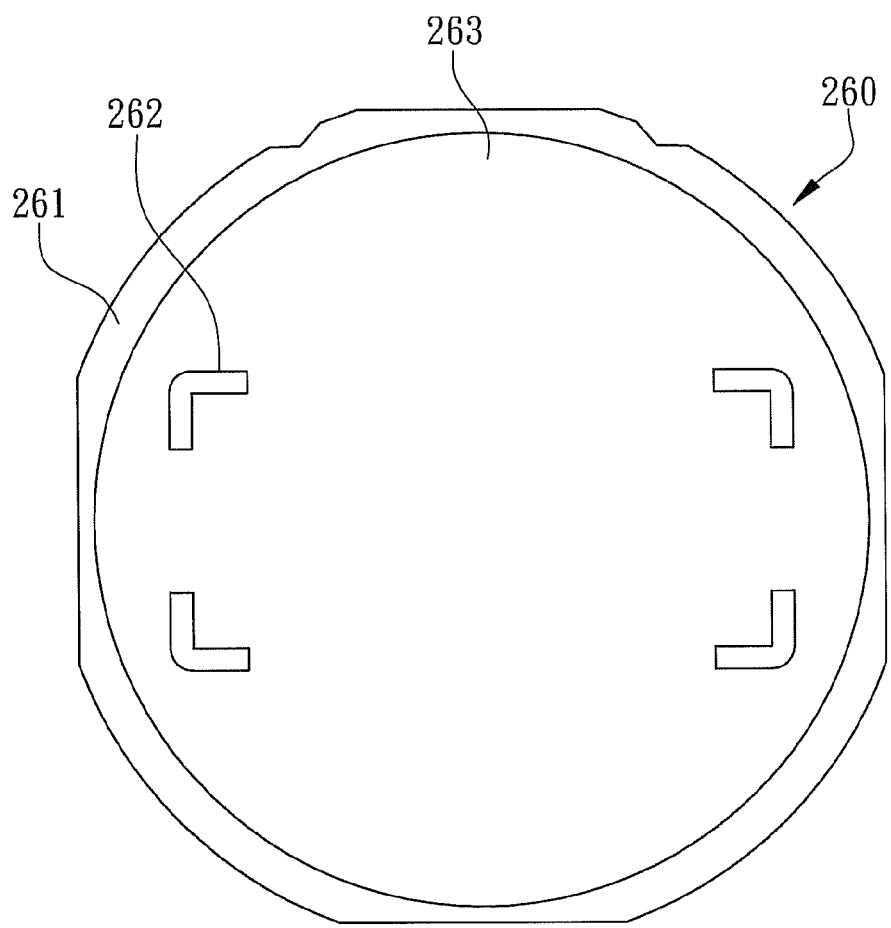
FIGS. 2A and 2B are a top view and a cross-sectional view of a wafer testing carrier utilized in the method for testing multi-chip stacked packages according to the preferred embodiment of the present invention.
Figure 2B:
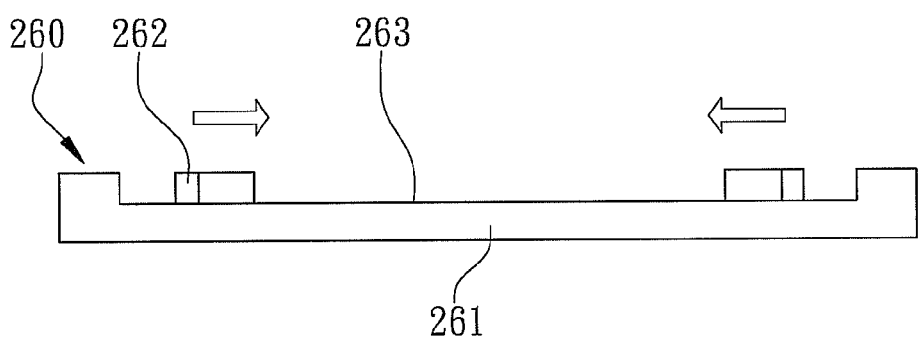

As shown in FIG. 2A and FIG. 2B, in the present embodiment, the wafer testing carrier 260 may have a disc-like major body 261 made of hard materials such as copper, iron, or alloy to provide a hard placing surface 263 for carrying the tape carrier 250. To be more specific, the wafer testing carrier 260 has a plurality of fixing kits 262 disposed on the placing surface 263 of the major body 261 to position the tape carrier 250. As shown in FIG. 4, the clamps 262 can clamp a plurality of corners 253 of the tape carrier 250 where the tape carrier 250 has an adhesive tape 252 adhered the substrate-less chip cubes 100. Therefore, the substrate-less chip cubes 100 accompanied with the tape carrier 250 can be loaded into a wafer tester 270 though the wafer testing carrier 260 without releasing from the adhesive tape 252.

Figure 3A:
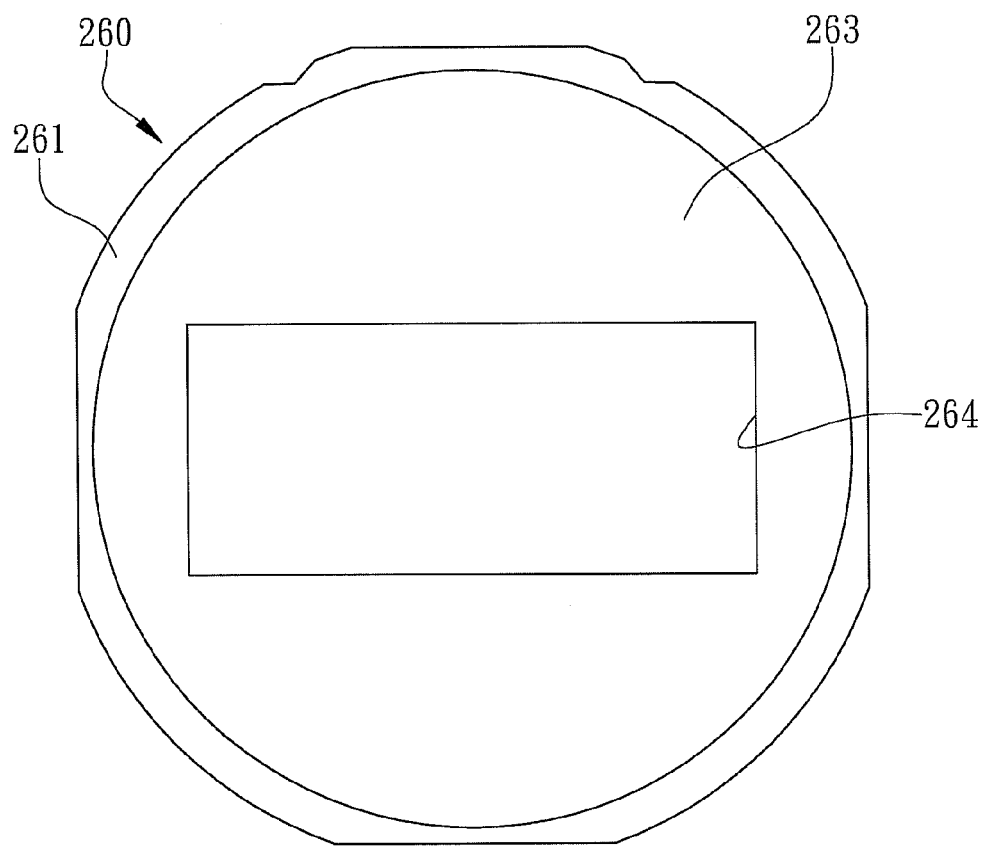
FIGS. 3A and 3B are a top view and a cross-sectional view of another wafer testing carrier utilized in the method according to a variant embodiment of the preferred embodiment of the present invention.
Figure 3B:
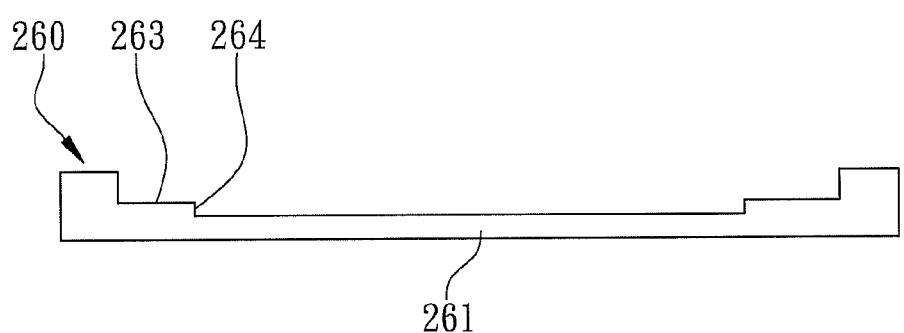

As shown in FIG. 3A and FIG. 3B, in a various embodiment, the major body 261 of the wafer testing carrier 260 further has a fitting window 264 sunk from the placing surface 263 with a shape matching to the shape of a tape carrier 250. When the tape carrier 250 is installed on the placing surface 263, the bottom portion of the tape carrier 250 is partially embedded into the fitting window 264 to achieve fixing the tape carrier 250 on the wafer testing carrier 260.

Figure 5:
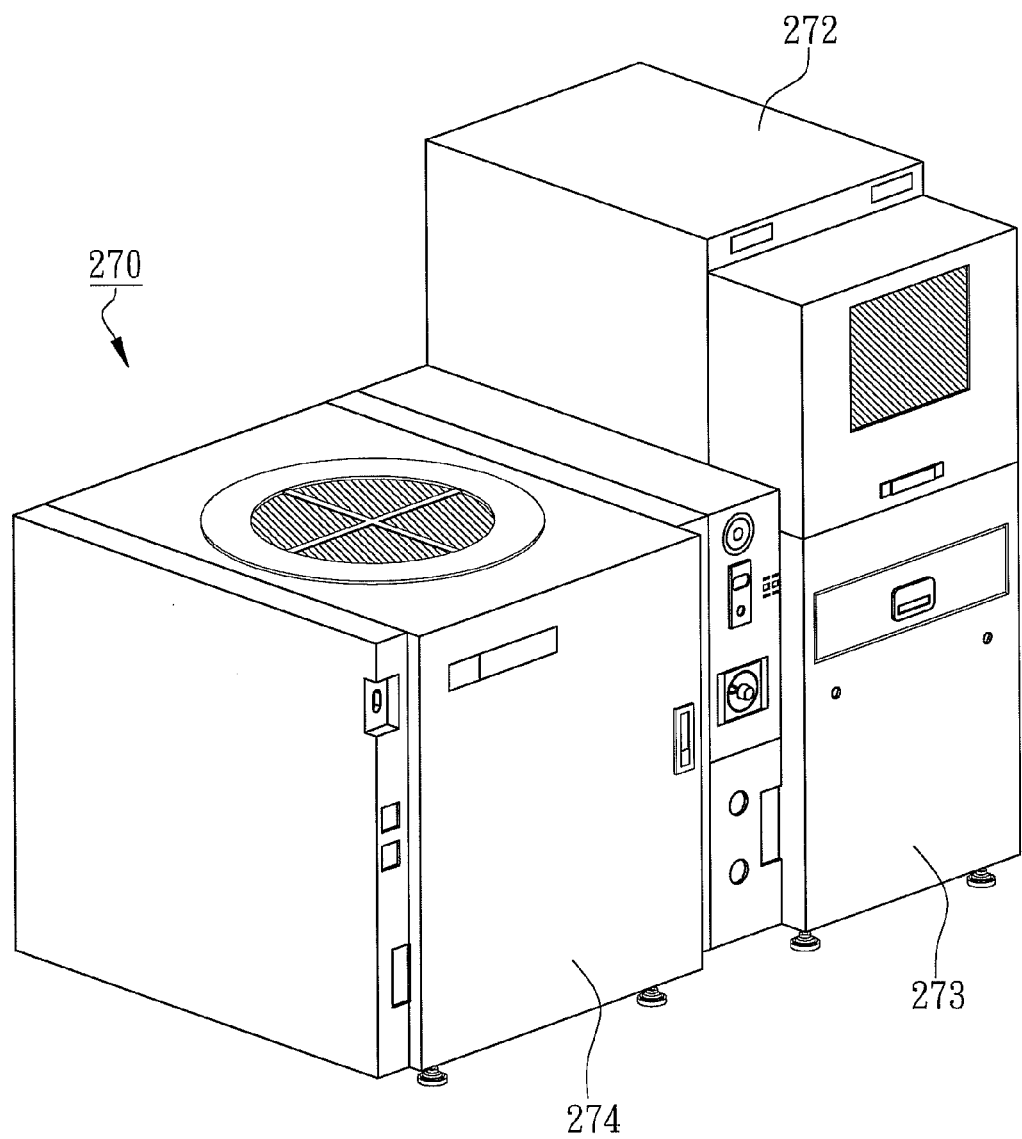
FIG. 5 is a three-dimensional view of a wafer tester implemented in the method for testing multi-chip stacked packages according to the preferred embodiment of the present invention.

Then, as shown in FIG. 1H, the wafer testing carrier 260 is loaded inside the wafer tester 270, and a plurality of testing probes 271 inside the wafer tester 270 can probe on the testing electrodes 130 to electrically test the substrate-less chip cubes 100 where the testing probes 271 are installed on a probe card 275. As shown in FIG. 5, the wafer tester 270 includes a loading zone 272, a loading lock 273, and a testing zone 274 where wafer frames can be loaded and unloaded in the loading zone 272 and then transferred to the testing zone 274 after alignment check in the loading lock 273. The afore probe card 275 including the testing probes 271 is disposed in the testing zone 274 for electrical testing the testing electrodes 130 disposed on wafer surfaces. Since the wafer testing carrier 260 can meet the dimension of wafer frames and can directly be loaded into the loading lock 273 so that the testing probes 271 inside the testing zone 274 can probe the testing electrodes 130 of the substrate-less chip cubes 100 without releasing from the adhesive tape 252, without another transferring the substrate-less chip cubes 100 to another adhesive tape 252 and without changing the tape carrier 250 to reduce the testing cost, to increase the testing efficiency of wafer-level testing of multi-chip packages, and to meet the requirement of fine-pitch probing so that the substrate-less chip cubes 100 can be tested without disposed on an interposer with fan-out circuitry and fan-out electrodes to confirm the electrical connection between the stacked chips 110, i.e., the electrical connection between interconnecting electrodes 140. Furthermore, the method for testing multi-chip stacked packages of the present invention allows directly sorting the substrate-less chip cubes 100 inside the wafer tester 270 to sort out or remove bad substrate-less chip cube 100.

Figure 1I:
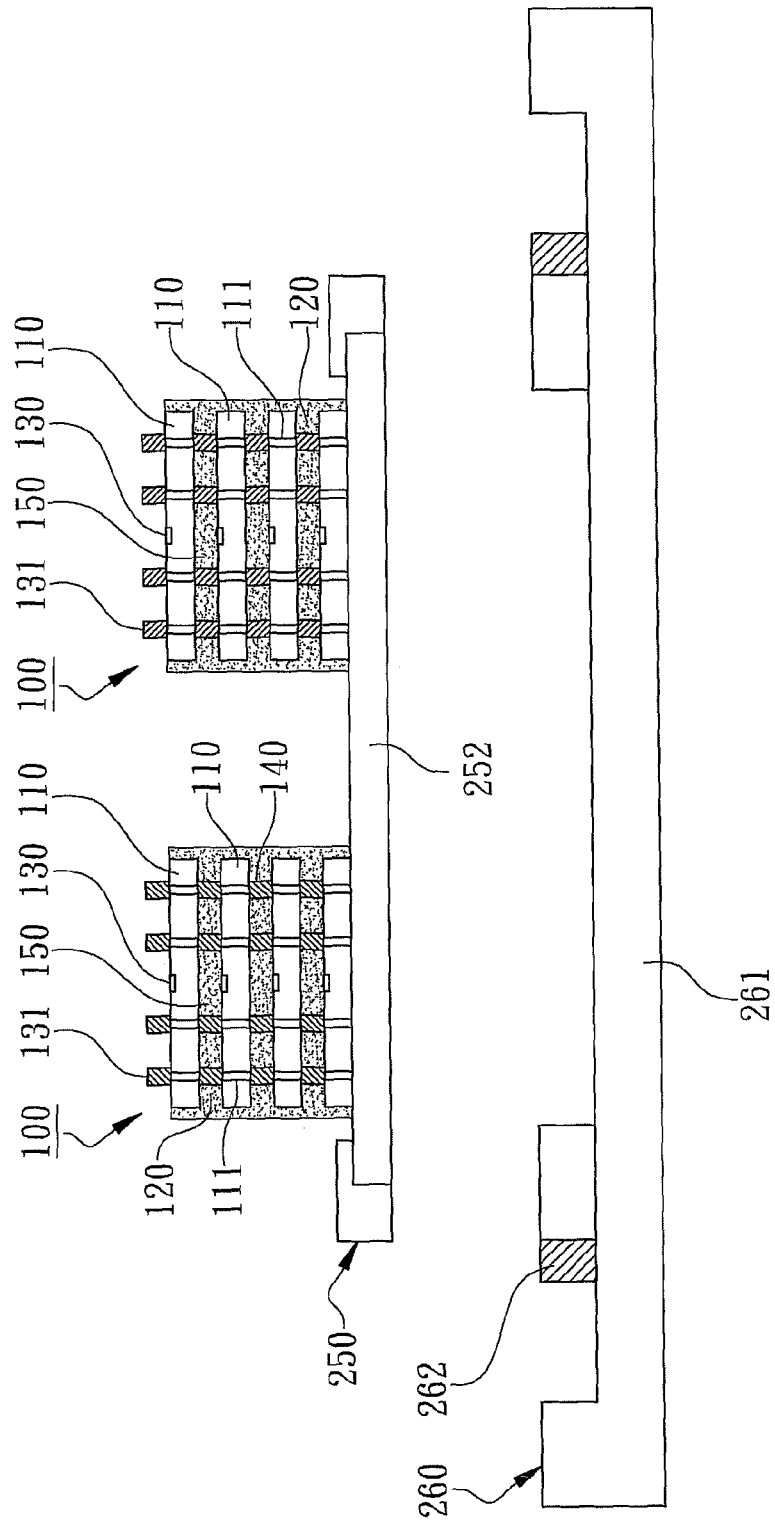

As shown in FIG. 1I, after testing, the method for testing multi-chip stacked packages further comprises the step of releasing the tape carrier 250 from the wafer testing carrier 260 so that the wafer testing carrier 260 can be recycled. Moreover, the following steps may comprise marking, packing, and so on.

Therefore, the method for testing multi-chip stacked packages of the present invention can be implemented in the existing wafer tester to achieve probing of fine-pitch electrodes of the substrate-less chip cubes 100 without an interposer to provide good substrate-less chip cubes 100 and to sort out good and bad substrate-less chip cubes 100 to reduce the number of adhering processes of the adhesive tape to achieve lower packaging cost and to prevent SMT bad substrate-less chip cube on boards.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A method for testing a plurality of multi-chip stacked packages, comprising:
   providing one or more substrate-less chip cubes each consisting of a plurality of vertically stacked chips, wherein a stacked gap is formed between two adjacent chips and a plurality of testing electrodes are disposed on a top chip surface of each substrate-less chip cube;
   attaching the substrate-less chip cubes onto an adhesive tape with the testing electrodes away from the adhesive tape, wherein the adhesive tape is attached inside an opening of a tape carrier, wherein the tape carrier is a strip;
   forming a filling encapsulant on the adhesive tape to fully fill the stacked gaps between the stacked chips;
   fixing the tape carrier on a wafer testing carrier to allow the substrate-less chip cubes being loaded into a wafer tester without releasing from the adhesive tape;
   wherein the wafer testing carrier has a disc-shaped major body made of a hard material to provide a placing surface larger than the adhesive tape, and the adhesive tape is completely attached onto the placing surface so that the substrate-less chip cubes are supported on the wafer testing carrier; and
   probing the testing electrodes of the substrate-less chip cubes by a plurality of testing probes inside a wafer tester to electrically test the substrate-less chip cubes.

2. The method as claimed in claim 1, further comprising a step of releasing the tape carrier from the wafer testing carrier after the probing step.

3. The method as claimed in claim 1, wherein the wafer testing carrier is larger than the tape carrier where both have different shapes.

4. The method as claimed in claim 1, wherein the wafer testing carrier has a plurality of fixing kits disposed on the major body to fix the tape carrier.

5. The method as claimed in claim 4, wherein the fixing kits fix a plurality of corners of the tape carrier when the tape carrier is fixed.

6. The method as claimed in claim 1, wafer testing carrier further has a fitting window sunk from the placing surface, wherein the shape of the fitting window matches to the shape of the tape carrier.

7. The method as claimed in claim 1, wherein the step of forming the filling encapsulant includes a de-bleeding step of removing a bleeding portion of the filling encapsulant exceeding the footprints of the substrate-less chip cubes.

8. The method as claimed in claim 7, wherein the filling encapsulant encapsulates a plurality of sidewalls of the chips after the de-bleeding step.

9. The method as claimed in claim 1, wherein each chip has a plurality of through silicon vias disposed inside, wherein a plurality of interconnecting electrodes are disposed in the stacked gaps between the stacked chips of the substrate-less chip cubes to electrically connect the through silicon vias.

* * * * *